United States Patent
Sharon et al.

(10) Patent No.: US 9,070,427 B2
(45) Date of Patent: Jun. 30, 2015

(54) DATA CODING USING DIVISIONS OF MEMORY CELL STATES

(75) Inventors: Eran Sharon, Rishon Lezion (IL); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 590 days.

(21) Appl. No.: 13/502,189

(22) PCT Filed: Sep. 9, 2010

(86) PCT No.: PCT/IB2010/002245
§ 371 (c)(1),
(2), (4) Date: Apr. 16, 2012

(87) PCT Pub. No.: WO2012/020278
PCT Pub. Date: Feb. 16, 2012

(65) Prior Publication Data
US 2012/0210082 A1 Aug. 16, 2012

Related U.S. Application Data

(60) Provisional application No. 61/373,669, filed on Aug. 13, 2010.

(51) Int. Cl.
*G06F 12/00* (2006.01)
*G11C 7/10* (2006.01)
(Continued)

(52) U.S. Cl.
CPC .......... *G11C 7/1006* (2013.01); *G06F 12/0246* (2013.01); *G11C 11/5642* (2013.01); *G11C 16/10* (2013.01); *G11C 16/26* (2013.01)

(58) Field of Classification Search
CPC ...... G11C 16/10; G11C 7/1006; G11C 16/26; G06F 12/0246
USPC .......................................................... 711/154
See application file for complete search history.

(56) References Cited

U.S. PATENT DOCUMENTS

| | | | |
|---|---|---|---|
| 7,236,407 B2 | 6/2007 | Roohparvar et al. | |
| 7,388,781 B2 | 6/2008 | Litsyn et al. | |

(Continued)

FOREIGN PATENT DOCUMENTS

| | | |
|---|---|---|
| EP | 1424631 A1 | 6/2004 |
| WO | 0167462 A1 | 9/2001 |

OTHER PUBLICATIONS

International Search Report and Written Opinion for International Application No. PCT/IB2010/002245 mailed Dec. 1, 2010, 14 pages.

(Continued)

*Primary Examiner* — Aracelis Ruiz
(74) *Attorney, Agent, or Firm* — Toler Law Group, PC

(57) ABSTRACT

Data storage devices and methods to encode and decode data using divisions of memory cell states are disclosed. A method includes dividing data bits into disjoint multiple groups of data bits and storing the data bits into a plurality of memory cells. The storing is done by setting each of the plurality of memory cells to a corresponding state selected from at least three ordered states. For each of the multiple groups of data bits, when a request is received for reading a particular group of the data bits, the request is serviced by selecting a disjoint division of the at least three ordered states of the memory cells into a first set of states and a second set of states. Each of the states in the first set of states has a higher position than any of the states in the second set of states according to the order of the states. For each cell of the plurality of memory cells, a determination is made whether the cell is in the first set of states or the second set of states. Based on the determination, the particular group of the data bits is generated in response to the request for reading the particular group of the data bits without use of additional data that depends upon a state of one of the memory cells.

30 Claims, 9 Drawing Sheets

(51) Int. Cl.
*G11C 11/56* (2006.01)
*G11C 16/10* (2006.01)
*G11C 16/26* (2006.01)
*G06F 12/02* (2006.01)

(56) References Cited

U.S. PATENT DOCUMENTS

| | | |
|---|---|---|
| 7,970,957 B2 | 6/2011 | Mosek |
| 8,397,131 B1 * | 3/2013 | Sommer et al. ............ 714/763 |
| 2001/0052102 A1 | 12/2001 | Roohparvar |
| 2003/0115535 A1 | 6/2003 | March et al. |
| 2003/0218907 A1 | 11/2003 | Yano |
| 2007/0171730 A1 | 7/2007 | Ramamoorthy et al. |
| 2008/0137413 A1 | 6/2008 | Kong et al. |
| 2008/0151621 A1 | 6/2008 | Kong et al. |
| 2009/0080247 A1 | 3/2009 | Lasser |
| 2010/0082885 A1 | 4/2010 | Litsyn et al. |
| 2011/0258370 A1 | 10/2011 | Sharon et al. |

OTHER PUBLICATIONS

Rivest, Ronald L. et al. "How to Reuse a 'Write-Once' Memory," Information and Control, vol. 55, Nos. 1-3, Oct./Nov./Dec. 1982, Academic Press, 20 pages.

"Mixed Serial-Parallel Sensing Scheme for a 64-Mbit 4-bit/cell Factory-Programmed OTP-ROM," Abstract, Science Direct—Microelectronics Journal, vol. 30, Issue 9, Sep. 1999, http://www.sciencedirect.com/science?_ob=ArticleURL&_udi=B6V44-3WWT87N-8&_use . . . , 3 pages.

* cited by examiner

DATA CODING USING DIVISIONS OF MEMORY CELL STATES

CROSS-REFERENCE TO RELATED APPLICATIONS

The present application is a U.S. National Stage Application under 35 U.S.C. §371 of International Application No. PCT/IB2010/002245, filed Sep. 9, 2010, and claims priority to U.S. Provisional Application No. 61/373,669, filed Aug. 13, 2010, the contents of which are incorporated by reference herein in their entirety.

FIELD OF THE DISCLOSURE

The present disclosure is generally related to encoding and decoding data stored in memory cells.

BACKGROUND

Flash memory device may store multiple bits of data per memory cell by programming each cell to one of multiple states. For example, multi-level cell (MLC) flash memory can store three bits per cell using eight states per cell, four bits per cell using sixteen states per cell, or larger numbers of bits per cell. Although storing multiple bits per cell enables high-density operation, multiple sensing operations may be required to determine which state each cell is in, increasing a read latency of the MLC flash memory. To illustrate, in a three-bit MLC flash memory, seven sensing operations may be preformed to identify a state of each cell. In contrast, data may be read from a single-level cell (SLC) flash memory using a single sensing operation. However, SLC flash memories have a lower storage density than MLC implementations.

SUMMARY

Systems and methods of encoding and decoding data using divisions of memory cell states are disclosed. These coding methods enable fast reading from high density MLC flash memories, allowing usage of such cost efficient memories in applications which require low reading latency and high random read performance. Multiple groups of data bits may be stored in memory cells that are each programmed to have one of multiple possible states. Each group of data bits may be encoded and stored at the memory cells to be retrieved based on whether each cell has a state that is in a first set of the possible states (e.g. states 0-1 for a two-bit cell having states 0, 1, 2, or 3) or in a second set of the possible states (e.g. states 2-3 of the two-bit cell). When reading the memory cells, a data storage device may decide how to divide the states into the first set and the second set based on which group of data bits is to be read from the memory cells. Data may be generated based on a single reading of the cells. For example, data may be generated after reading a wordline of flash memory cells using a single sensing operation with a single comparison voltage.

DETAILED DESCRIPTION

Figure 1:
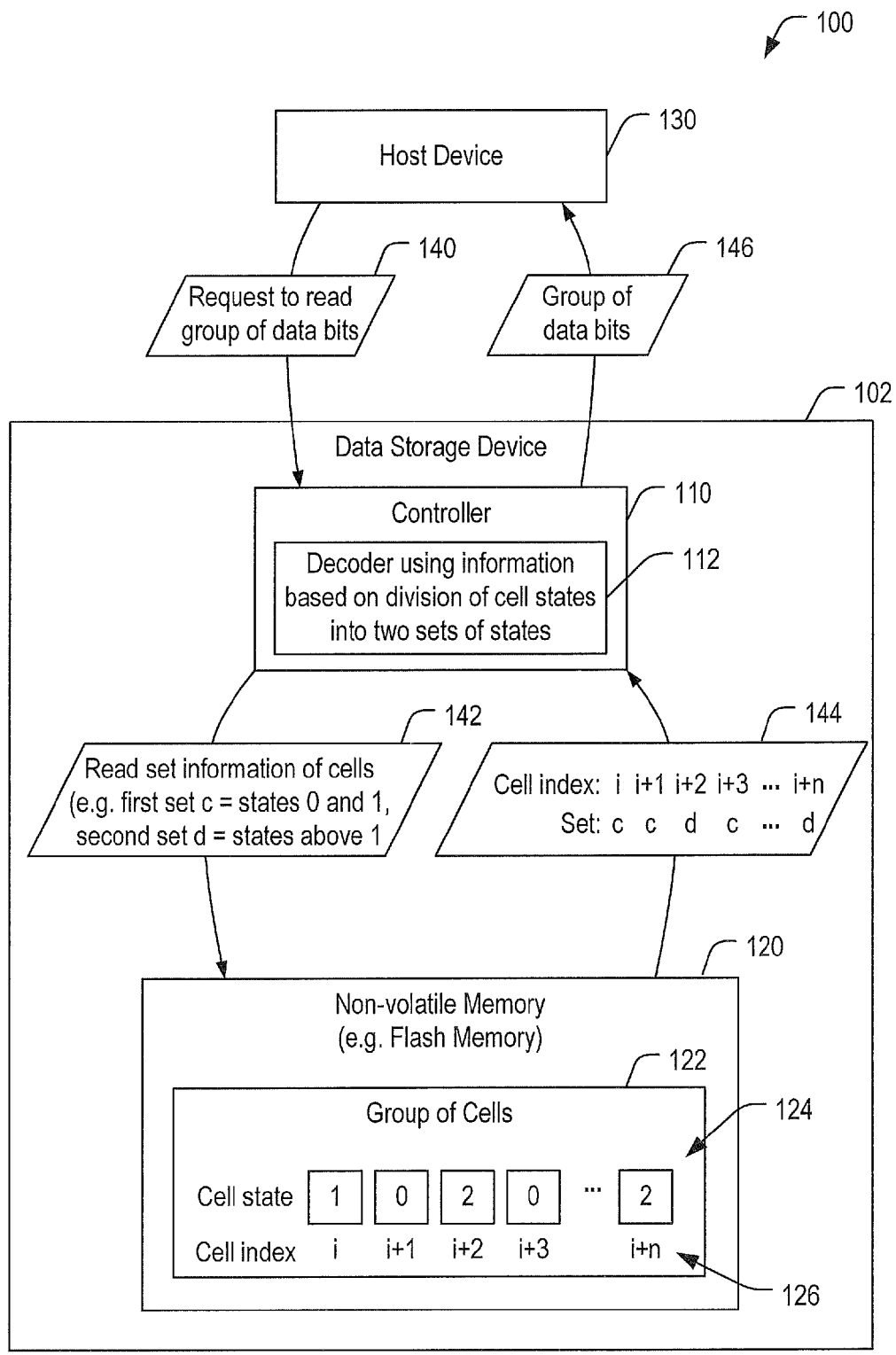
FIG. 1 is a diagram of a data storage device in communication with a host device in which the data storage device decodes information based on divisions of cell states.

Referring to FIG. 1, an illustrative embodiment of a system is depicted and generally designated 100. The system 100 includes a data storage device 102 coupled to a host device 130. The data storage device 102 includes a decoder 112 that uses information based on a division of cell states into two sets of states to read information stored in a non-volatile memory 120. By using information based on the division of cell states into two sets of states, the data storage device 102 enables efficient reading of data from the non-volatile memory 120. For example, the data storage device 102 can be configured to read data in the non-volatile memory 120 using a single sense operation of cells within the non-volatile memory 120.

The host device 130 may be a device that is configured to be operatively coupled to the data storage device 102, such as a mobile telephone, a music or video player, a personal digital assistant (PDA), a gaming device, an electronic-book reader, a camera, a computer (such as a laptop or notebook computer), any other electronic device, or any combination thereof. The host device 130 is configured to send a request 140 to the data storage device 102 to read a group of data bits. After sending the request 140, the host device 130 is configured to receive the requested group of data bits 146 from the data storage device 102.

The data storage device 102 includes a controller 110 configured to control an interface to the host device 130 and to perform management of the non-volatile memory 120. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device, such as eMMC® (trademark of JEDEC Solid State Technology Association, Arlington, Va.) and eSD, as illustrative examples.

The non-volatile memory 120 includes a representative group of cells 122. For example, the non-volatile memory 120 may be a flash memory, and the group of cells 122 may include a plurality of flash memory cells that are accessible via a single word line. The group of cells 122 is illustrated as each cell having a state 124 that is one of an ordered set of available states for the cell and having a cell index 126 associated with the cell. For example, the cell with cell index illustrated as "i" has a cell state illustrated as state "1". The cell with cell index "i+1" has a cell state "0," and the cell with cell index "i+n" has a cell state "2." The cell states may correspond to threshold voltages of flash memory cells in a multi-level cell (MLC) implementation, as described in further detail in FIG. 4.

The decoder 112 is configured to respond to the request 140 to read the group of data bits by selecting a division of cell states corresponding to the group of cells 122. The decoder 112 may send a read instruction 142 to the non-volatile memory 120 to read state information of the cells in the group of cells 122. For example, the decoder 112 may determine that a first set of states (set "C") of the group of cells 122 may be state 0 and state 1, while a second set of states (set "D") may include all states above state 1, such as state 2, state 3, and any available states ordered higher (i.e. having a higher position in the order of states) than state 3. The read instruction 142 is sent to the non-volatile memory 120. A sensing operation may be performed that determines whether each cell in the group of cells 122 corresponds to the first set (C) or the second set (D). For example, the sense operation may include selecting a read threshold voltage for a voltage sensing operation, where the read threshold voltage defines whether a cell corresponds to the first set of states (state 0 or state 1), or corresponds to the second set of states (in state 2 or higher).

Cell index and set information 144 is returned to the controller 110. The cell index and set information 144 may represent whether, for each particular cell in the group of cells 122, the particular cell is in the first set of states (C) or the second set of states (D). For example, the cell index and set information 144 indicates that the cell with index i is in set C, the cell with index i+1 is in set C, and the cell with index i+2 is in set D. The decoder 112 is configured to decode the cell index and state information 144 and to generate the group of data bits 146 that is provided to the host device 130.

As an example, the data storage device 102 may include a flash memory implemented as a solid state drive (SSD) or memory for mobile applications that provides high random input/output (I/O) performance. The data storage device 102 may therefore use an efficient scheme for programming and reading of small chunks of data (e.g. 0.5 kilobytes (KB)-4 KB) from random addresses (e.g. reading from starting addresses that are aligned to 0.5 KB boundaries). The non-volatile memory 120 may be implemented using high density Multi-Level Cell (MLC) memories for cost efficiency, such as using three-bit (eight cell levels) or four-bit (16 cell levels) MLC flash technologies.

Conventionally, each physical page, corresponding to a wordline (WL), in an MLC flash stores log 2(M) logical pages of data, where M is the number of levels to which each cell is programmed. For example, a three-bit MLC flash cell is programmed to 8 levels and a WL for a three-bit MLC flash stores 3 logical pages.

In order to allow fast reading of the non-volatile memory 120 (e.g. a MLC flash), the data storage device 102 reduces the number of sense operations that are performed in order to retrieve requested data. To illustrate, conventional interleaved coding schemes where data is encoded into a codeword which is spanned over all the logical pages of the wordline (WL) may be inefficient because M–1 sense operations need to be used for retrieving any data chunk (even 0.5 KB) since the data is encoded on all M states. More efficient conventional coding schemes for random reading may include non-interleaved or semi-interleaved coding schemes where the basic data chunk (e.g. 0.5 KB or 1 KB) is encoded over a single logical page, allowing its retrieval with only (M–1)/log 2(M) sense operations on the average (i.e. faster by a factor of log 2(M) compared to an interleaved coding scheme).

In contrast to conventional interleaved, semi-interleaved, or non-interleaved schemes, the data storage device 102 provides even faster random reading by enabling reading of small data chunks using only a single sense operation. Data reads from the non-volatile memory 120 may be faster by a factor of M–1 compared to an interleaved coding scheme and faster by a factor of (M–1)/log 2(M) compared to non-interleaved and semi-interleaved coding schemes.

The data storage device 102 implements a coding scheme where data is divided into M–1 equal (or possibly non-equal) portions to encode the j-th portion of the data (j=1, M–1) in the indices of the cells that will be "on" when a single sense operation is performed between the j–1 and the j states (e.g. MLC cell programming levels). This way, each 1/(M–1) portion of the data can be read using a single sense operation.

The coding scheme implemented by the data storage device 102 is referred to herein as a "True Random IO" ("TRIO") coding scheme. The TRIO coding scheme for an MLC Flash with M programming levels may encode the first 1/(M–1) portion of the data in the indices of the cells that will be "on" when a sense operation is performed between levels 0 and 1, the second 1/(M–1) portion of the data in the indices of the cells that will be "on" when a sense operation is performed between levels 1 and 2, the third 1/(M–1) portion of the data in the indices of the cells that will be "on" when a sense operation is performed between levels 2 and 3, and so on until the (M–1)-th portion of the data is encoded in the indices of the cells that will be "on" when a sense operation is performed between levels M–2 and M–1.

Such a coding scheme can be shown to have a one-to-one mapping from information sequences to cell level sequences such that any information sequence is encodable, and that there exists a decoding procedure that enables recovery of the information sequence from the encoded cells sequence. This can be shown through a reduction from the problem of multiple programming of an OTP memory. One Time Programmable (OTP) memories are configured so that each cell can store a single bit and can be programmed only once from an erased state ("1") to a programmed state ("0"). Once a cell is programmed it cannot change its state anymore. Such a memory can model a punch card, where information is programmed to the card by punching holes in it, optical OTP media, or flash OTP media (e.g. EROM).

It is known in the art of coding that a coding scheme ("OTP coding scheme") exists that allows programming of k bits into n cells of an OTP memory t times, if n≥k*t/log 2(t). Thus, an overhead of n/k=t/log 2(t) is sufficient to ensure the possibility to write k bits into n cells t times. This overhead is conjectured to be a tight estimate of the minimal required overhead only for large values of t. For small values of t the estimate may be pessimistic. For example, for t=2, there exists a coding scheme that requires an overhead of only ~1.2938, which is smaller than t/log 2(t)=2.

For example, an OTP coding scheme may enable writing k bits into n cells of a punch card t times. Let $I_j$ denote the information written in the j-th time and Cj denotes the sequence of "holes" punched into the punch card cells in the j-th time, respectively. A programming and reading procedure of the punch card for t=3 may be implemented in the encoding and decoding system 200 illustrated in FIG. 2.

Figure 2:
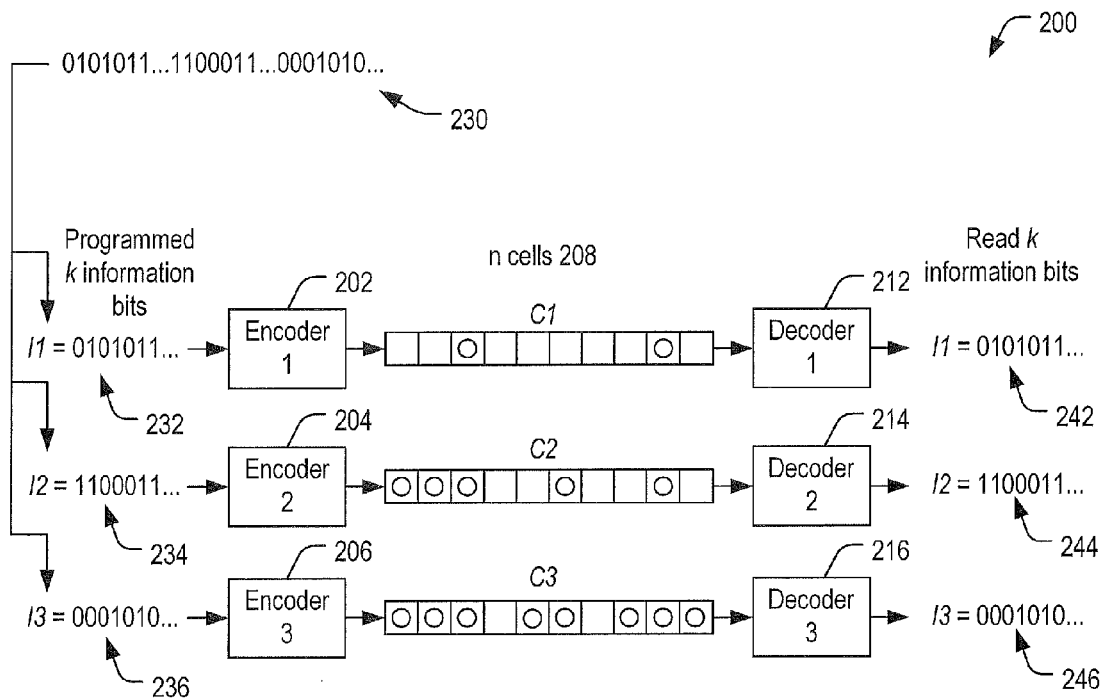
FIG. 2 is a diagram of a system to encode and decode data based on indices of cells corresponding to particular cell states.

The system 200 of FIG. 2 includes a first encoder 202, a second encoder 204, and a third encoder 206 that program data to a group of n cells 208. A first decoder 212, a second decoder 214, and a third decoder 216 decode information read from the n cells 208. Data bits 230 are divided into disjoint multiple groups of data bits 232, 234, and 236. The first encoder 202 stores the first group of data bits 232 to the cells 208 using a first encoding C1. The first decoder 212 can read the cells 208 and generate a first group of decoded data bits 242 according to the first decoding C1.

The second encoder 204 stores the second group of data bits 234 to the cells 208 using a second encoding C2. The second encoding C2 may only program cells that were not programmed by the first encoder 202 and does not erase any programmed cell (e.g. continuing the punch card analogy, the second decoder 204 may punch new holes but may not "unpunch" existing holes). The second decoder 214 can read the cells 208 and generate a second group of decoded data bits 244 according to the second decoding C2.

The third encoder 206 stores the third group of data bits to the cells 208 using a third encoding C3 that may only program cells that were not programmed by the first encoder 202 or the second encoder 203 and does not erase any programmed cell. The third decoder 216 can read the cells 208 and generate a third group of decoded data bits 246 according to the third decoding C3.

A reduction can be made from the problem of multiple programming of an OTP memory to the problem of TRIO coding. The same or a similar coding scheme described above for programming k bits into n OTP memory cells t times may be used to implement a TRIO coding scheme for an MLC flash with M=t+1 programming levels. For example, to program K bits into an MLC WL, the K bits may be divided into t subsets each of size k=K/t. An OTP-type coding scheme may be used to encode each subset of k bits, where the "holes" punched into the punch card in the j-th programming step (j=1, t=M−1) are replaced by the label "M−j", representing an MLC flash cell that is programmed to the (M−j)-th level. After encoding the t subsets of k bits into a sequence of programming levels, cells that have not yet been assigned any programming level are assigned with the level "0" (i.e. an erase level of the MLC flash). Encoding each subset of k bits results in a valid assignment of programming levels to all the cells, and the WL can be programmed accordingly.

To read the j-th subset of k bits, a single sense operation can be performed between programming levels M−j−1 and M−j. The result of this reading is a binary vector, from which the k bits of information can be recovered by using the decoding scheme of the OTP memory. The programming and reading procedures according to the TRIO coding scheme are illustrated in FIG. 3, for an MLC Flash with M=4.

The reason for assigning the label "M−j" during the j-th programming step (as opposed to the label "j") is related to a probability distribution that may be induced over the programming levels when using an OTP coding scheme. An OTP coding scheme tends to increase the fraction of cells that are programmed from one programming step to the next. Hence, by assigning the programming levels along the programming steps from high to low a distribution is induced over the programming levels, in which high levels are less probable than low levels. In flash memories such a "shaping" of the distribution may tend to induce less cell wearing and less program disturb effects.

Figure 3:
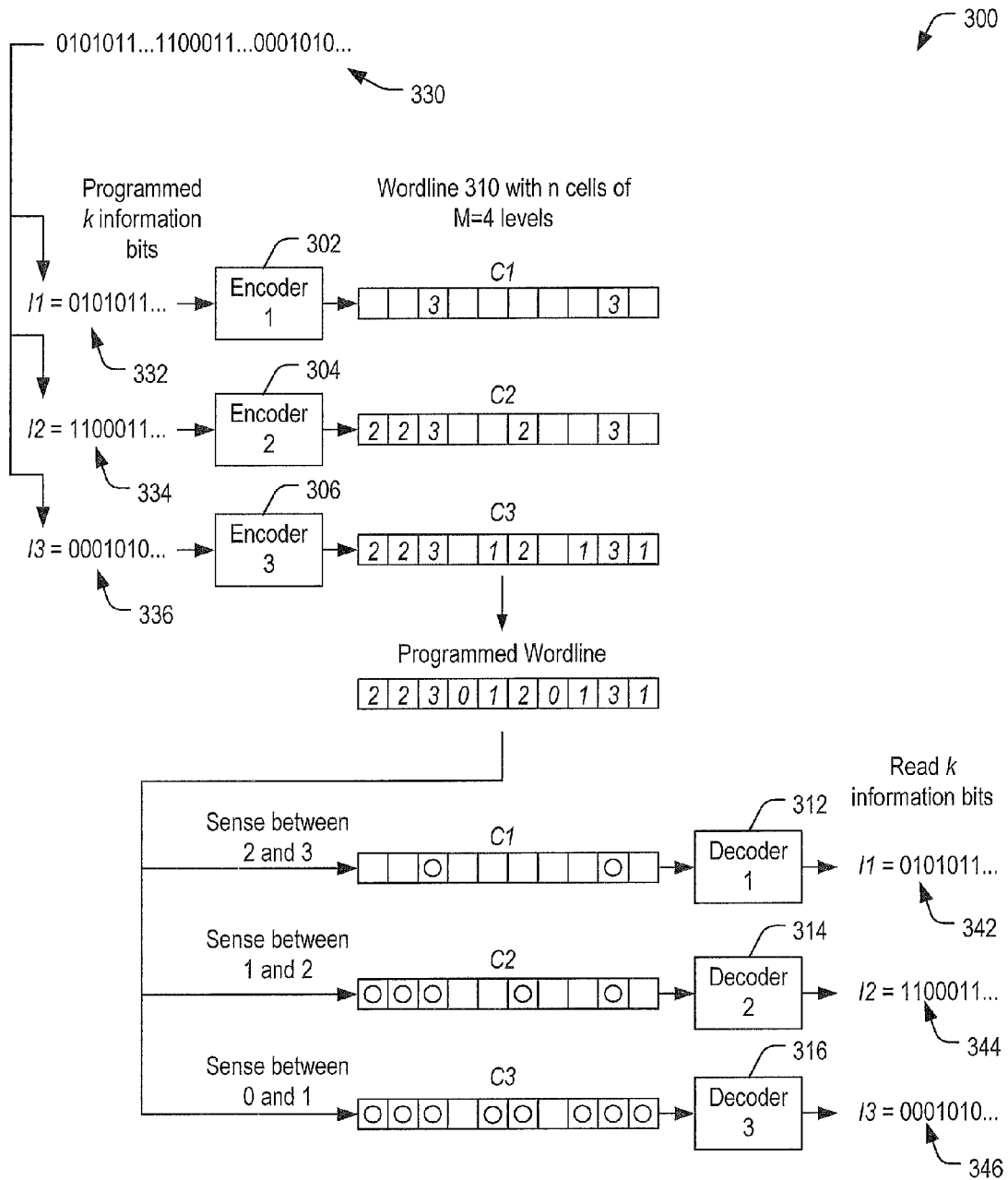
FIG. 3 is a diagram of a system to encode and decode data based on indices of cells corresponding to divisions of cell states.

FIG. 3 illustrates a system implementing a TRIO coding scheme for programming 3*k bits into n cells of a flash with M=t+1=4 programming levels. The system 300 of FIG. 3 includes a first encoder 302, a second encoder 304, and a third encoder 306 that program data to a wordline 310 with n cells of M=4 levels. A first decoder 312, a second decoder 314, and a third decoder 316 decode information read from the n cells of the wordline 310. Data bits 330 are divided into disjoint multiple groups of data bits 332, 334, and 336. The first encoder 302 stores the first group of data bits 332 to the n cells of the wordline 310 using a first encoding C1 that either leaves each cell in an erased state or programs the cell to level 3. The second encoder 304 stores the second group of data bits 334 to the n cells of the wordline 310 using a second encoding C2. The second encoding C2 may only program cells that were not programmed by the first encoder 302 to level 2 and does not erase any programmed cell. The third encoder 306 stores the third group of data bits to the n cells of the wordline 310 using a third encoding C3 that may only program cells to level 1 that were not programmed by the first encoder 302 or the second encoder 303 and does not erase any programmed cell.

The first decoder 312 can read the n cells of the wordline 310 and generate a first group of decoded data bits 342 according to the first decoding C1 by performing a sense operation at a threshold level between levels 2 and 3. The second decoder 314 can read the n cells of the wordline 310 and generate a second group of decoded data bits 344 according to the second decoding C2 by performing a sense operation at a threshold level between levels 1 and 2. The third decoder 316 can read the n cells of the wordline 310 and generate a third group of decoded data bits 346 according to the third decoding C3 by performing a sense operation at a threshold level between levels 0 and 1. FIG. 3 illustrates a result of each sensing operation as information about whether each cell has a state higher than the threshold (illustrated as the cell containing an "O") or a state lower than the threshold (indicated as the cell not containing an "O").

An OTP code or TRIO code may be implemented as a coset code. Each information sequence can be represented by multiple codewords. Based on the codeword which was programmed in the previous programming step, a valid codeword can be chosen for the current programming step, i.e. a codeword may be selected in the current programming step whose support set contains the support set of the codeword programmed in the previous programming step. The support set of a codeword may be the set of cells programmed to "0."

A simple example of a coset code is shown in Table 1 and Table 2 for illustrative purposes (implementation of a coset code, such as by the data storage device 102 of FIG. 1, would include significantly longer codewords for increased efficiency). The example code can be used for programming k=2 bits into n=3 cells of an OTP memory t=2 times. Alternatively, the example code can be used for implementing a TRIO coding scheme for an MLC flash with M=t+1=3 programming levels. The TRIO coding scheme will allow programming K=k*t=4 bits into n=3 MLC cells with M=3 levels, such that each set of k=2 bits can be recovered using a single sense operation. The first k=2 bits can be recovered by sensing between levels 2 and 1. The second k=2 bits can be recovered by sensing between levels 1 and 0.

Table 1 illustrates a code used in a first programming:

| Information | Code |
|---|---|
| 0 0 | 0 1 1 |
| 0 1 | 1 0 1 |
| 1 0 | 1 1 0 |
| 1 1 | 1 1 1 |

Table 2 illustrates a coset code used in a second programming:

| | Codeword in first programming | | | |
|---|---|---|---|---|
| Information | 0 1 1 | 1 0 1 | 1 1 0 | 1 1 1 |
| 0 0 | 0 1 1 | 1 0 0 | 1 0 0 | 1 0 0 |
| 0 1 | 0 1 0 | 1 0 1 | 0 1 0 | 0 1 0 |
| 1 0 | 0 0 1 | 0 0 1 | 1 1 0 | 0 0 1 |
| 1 1 | 0 0 0 | 0 0 0 | 0 0 0 | 1 1 1 |

As Table 2 illustrates, each information sequence is represented by multiple codewords. An appropriate codeword is chosen according to the codeword that was programmed during the first programming.

Table 3 illustrates an encoding table as an example of the encoding of Tables 1 and 2 for a flash memory having M=3 programming levels (represented as 0, 1, and 2). Two sets of two bits are programmed into three cells, such that each two bits can be read using a single sense operation.

TABLE 3

Encoding flash based on Tables 1 and 2

| Second set of information bits | First set of information bits | | | |
|---|---|---|---|---|
| | 0 0 | 0 1 | 1 0 | 1 1 |
| 0 0 | 2 0 0 | 0 2 1 | 0 1 2 | 0 1 1 |
| 0 1 | 2 0 1 | 0 2 0 | 1 0 2 | 1 0 1 |
| 1 0 | 2 1 0 | 1 2 0 | 0 0 2 | 1 1 0 |
| 1 1 | 2 1 1 | 1 2 1 | 1 1 2 | 0 0 0 |

TABLE 4

Decoding flash using single sense operation

| Read codeword | 011/100 | 010/101 | 001/110 | 000/111 |
|---|---|---|---|---|
| Decoded information | 0 0 | 0 1 | 1 0 | 1 1 |

As an example, a first set of two bits=(1 0) and a second set of two bits=(1 1). Using table 3, the states (1 1 2) are programmed into a flash memory. For example, state "0" may correspond to a lowest threshold voltage range of a flash memory cell, state "1" may correspond to an intermediate threshold voltage range, and state "2" may correspond to a highest threshold voltage range. Programming the states (1 1 2) includes programming a first cell to state "1," a second cell to state "1," and a third cell to state "2."

In order to read the first two bits, a sense operation can be performed between state 1 and state 2 to determine whether the cell has a threshold voltage above state 1 (read as a "0" output) or below state 2 (read as a "1" output). The sense operation between states 1 and 2 of the cells programmed to (1 1 2) results in a "110" output that is decoded as "10" (see Table 4). In order to read the second two bits, a sense operation is performed between states 0 and 1 to produce a "000" output that is decoded as "11."

The simple code described in Tables 1-4 is not efficient because it is very short. For example, when used as a TRIO code, it allows programming only K=k*t=4 bits into n=3 MLC cells, to store only 4/3=1.333 bits per cell. However, the theoretic capacity of an MLC cell with M=t+1=3 levels is log 2(M)=1.585 bits per cell.

A longer code can be more efficient. A general idea of constructing an efficient OTP/TRIO code can be to build a set of coset codes one on top of the other. In each stage a code book can be "built" on top of each of the codewords of the previous stage coset code, such that the support set of each new codeword contains the support set of a codeword or codewords from the previous stage coset code. Codewords may be selected that have as few "0's" as possible, while still allowing representation of each of the $2^k$ information sequences. Codewords with a reduced number of "0's" may enable further programming of the memory cells, as an increased number of the cells remain "erased."

For example, in the case of a MLC flash with M=t+1=3 levels, asymptotic analysis shows that an efficient TRIO coding scheme based on a long coset code can allow programming K=k*t=k*2 bits into n MLC cells, where n=1.2398*k. Hence, 2*k/n=2/1.2938=1.5458 bits per cell may be programmed, providing an improvement over the 1.333 bits per cell of the example code of Tables 1 and 2. The theoretic achievable density with M=3 programming levels of 1.585 bits per cell may be unattainable when the TRIO coding scheme introduces inherent "shaping" over the distribution of probabilities to program each programming level, making it non-uniform. However, the reduced storage density as compared to the theoretical maximum may be compensated by other benefits because the induced distribution "shaping" may result in reduced cell wearing and reduced program disturb effects.

Figure 4:
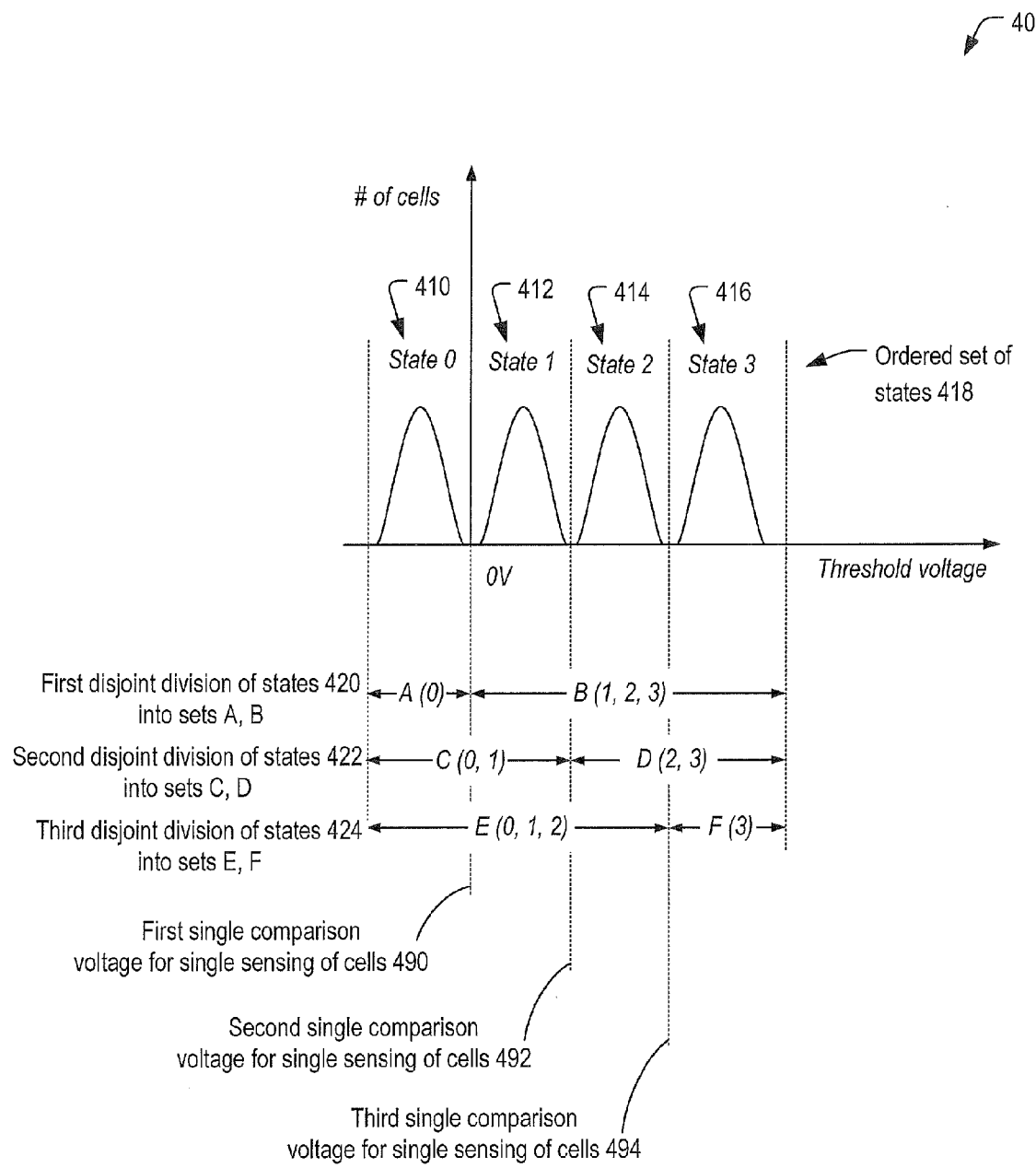
FIG. 4 is a diagram of a particular embodiment of disjoint divisions of cell states.

Referring to FIG. 4, a particular embodiment of disjoint divisions of cell states that may be used by the systems of FIGS. 1 and 3 is depicted and generally designated 400. A representative set of cell states is illustrated via a cell voltage distribution (CVD) for a multi-level cell (MLC) having four available states, indicated as state 0 410, state 1 412, state 2 414, and state 3 416. The states 0-3, 410-416 form an ordered set of states 418. For example, the order of the set of states 418 corresponds to a threshold voltage of the cells within each state 410-416. A distribution curve is illustrated indicating a number of cells having the particular threshold voltage values within each state 410-416 in a representative memory device. Although four states are illustrated in FIG. 4, in other embodiments fewer than four states may be used or more than four states may be used.

Each state 410-416 may be identified by applying a sense operation using a comparison voltage that substantially corresponds to a midway point between neighboring states. For example, a sense operation may be performed that compares a cell threshold voltage to a first single comparison voltage 490 that occurs at roughly 0 volts (V). Cells having threshold voltages of less than the first single comparison voltage 490 may be identified as being in state 0 (e.g. an erased state) 410, while cells having threshold voltages higher than the first single comparison voltage 490 may be identified as being in any of states 1-3 (e.g. programmed states) 412-416.

A sense operation using the first single comparison voltage 490 results in a first disjoint division of states 420 into one set of states (A) and another set of states (B). For example, set A includes state 0, represented as A (0), and set B includes state 1, state 2, and state 3, designated as B (1, 2, 3). Each of the states in set B (a first set of states) has a higher position than any of the states in set A (a second set of states) according to the order of the states. Performing a single sense operation that compares each cell's threshold voltage to the first single comparison voltage 490 generates information indicating whether each cell has a state in set A or in set B, corresponding to the first disjoint division of states 420.

A sense operation using a second single comparison voltage 492 results in a second disjoint division of states 422 into sets C and D. For example, set C includes state 0 and state 1, represented as C (0, 1), and set D includes state 2 and state 3, designated as D (2, 3). Performing a single sense operation that compares each cell's threshold voltage to the second single comparison voltage 492 generates information indicating whether each cell has a state in set C or in set D, corresponding to the second disjoint division of states 422.

A sense operation using a third single comparison voltage 494 results in a third disjoint division of states 424 into sets E and F. For example, set E includes state 0, state 1, and state 2, represented as E (0, 1, 2), and set F includes state 3, designated as F (3). Performing a single sense operation that compares each cell's threshold voltage to the third single comparison voltage 494 generates information indicating whether each cell has a state in set E or in set F, corresponding to the third disjoint division of states 424.

Figure 5:
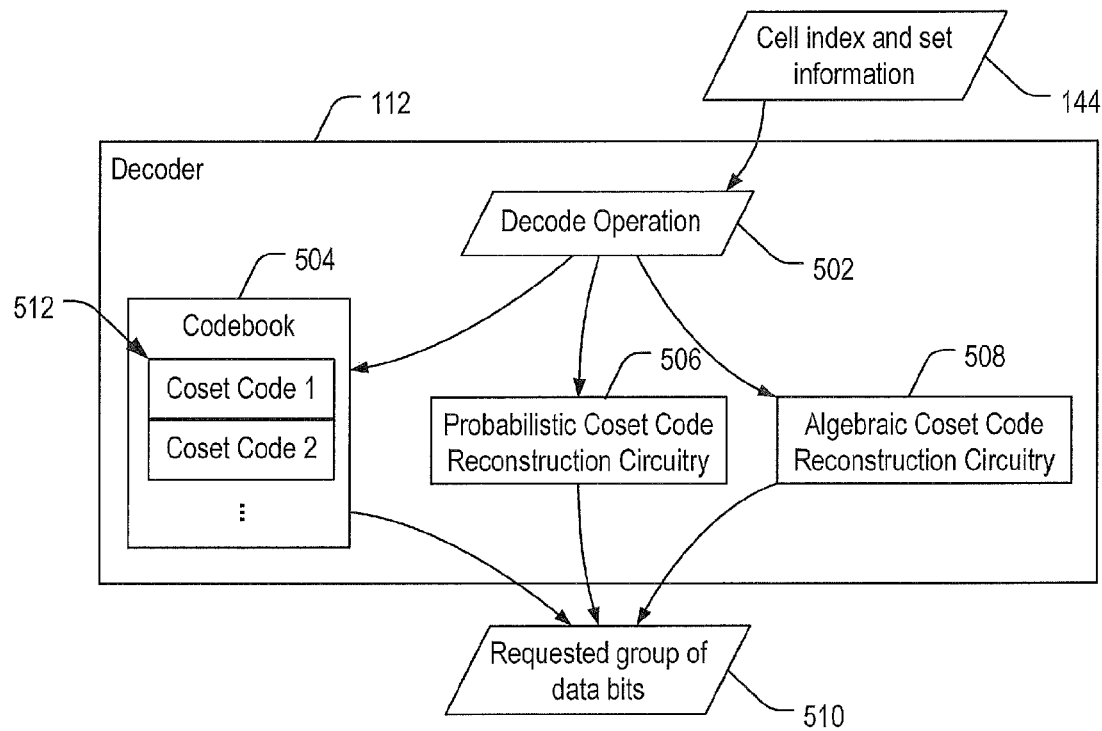
FIG. 5 is a diagram of a first embodiment of a decode operation at the decoder 112 of FIG. 1.

FIG. 5 depicts a particular embodiment of the decoder 112 of FIG. 1. The decoder 112 in the illustrated embodiment receives the cell index and set information 144, as described in FIG. 1, and may initiate a decode operation 502. In one embodiment, the decode operation 502 may include performing a look-up operation at a codebook 504. The codebook 504 may include multiple coset codes 512. The decode operation 502 may include selecting a particular coset code of the multiple coset codes 512 and using the selected coset code to decode the cell index and set information 144 to generate the requested group of data bits 510.

In another embodiment, the decode operation 502 may be performed according to a probabilistic coset coding scheme, such as by providing the cell index and set information 144 to probabilistic coset code reconstruction circuitry 506. The probabilistic coset code reconstruction circuitry 506 may generate the requested group of data bits 510. For example, a probabilistic coset coding scheme may be based on iterative methods and may combine error correction codes within the coset code. In yet another alternative embodiment, the decode operation 502 may be performed according to an algebraic coset coding scheme, such as by using algebraic coset code reconstruction circuitry 508. The algebraic coset code reconstruction circuitry 508 may decode the cell index and set information 144 to generate the requested group of data bits 510. Examples of probabilistic and algebraic coset coding are described in U.S. Provisional Patent Application No. 61/100,732 and U.S. patent application Ser. No. 12/567,771, the contents of each of which are expressly incorporated by reference herein in their entirety.

Although the decoder 112 is illustrated as containing each of the codebook 504, the probabilistic coset code reconstruction circuitry 506, and the algebraic coset code reconstruction circuitry 508, other embodiments of the decoder 112 may include only one, two, or none of the codebook 504, the probabilistic coset code reconstruction circuitry 506, or the algebraic coset code reconstruction circuitry 508.

TRIO coding solutions described with respect to FIGS. 2-5 have been based on an OTP reuse coding scheme because knowing the theoretical bounds on the achievable efficiency of an OTP reuse coding scheme enables existence of efficient TRIO coding schemes to be demonstrated. However, OTP reuse coding is "harder" than TRIO coding. In the OTP scenario the overall K=t*k bits are not available simultaneously and at each programming stage only k bits are provided. In contrast, in the TRIO scenario all the K bits are available simultaneously. Hence, simpler coding solutions for the TRIO scenario may exist that are not applicable to the OTP reuse scenario.

For example, the TRIO coding implementation may be similar to a multiple access channel coding. M−1 data streams, each of k bits, "compete" over n cells. The first encoded data stream tries to program some cells to level M. The second encoded data stream tries to program some cells to level M−1, . . . and so on until the last encoded data stream tries to program some cells to level 1. The cells which were not programmed by any of the encoded data streams remain "erased" i.e. at level 0. However, there may be collisions, as two or more encoded data streams may try to program the same cell to different programming levels. Collisions may be acceptable in implementations that allow errors caused by the collisions. One reason that errors may be acceptable is that the encoded data streams have redundancy.

To illustrate, in an example system that achieves the cell's theoretical capacity and stores log 2(M) bits per cell, a word line of n cells stores K=n*log 2(M) bits. According to a TRIO coding scheme the K bits are divided into M−1 subsets of k bits (where each subset is encoded separately). Hence, k=K/(M−1)=n*log 2(M)/(M−1). The j-th subset of k bits is encoded into a binary vector of length n which indicates which cells are to be programmed to level M−j. Hence the code rate is R=k/n=n*log 2(M)/(M−1)/n=log 2(M)/(M−1). As M increases, the code rate becomes lower (i.e. the encoding includes more redundancy). As M increases, therefore, a TRIO encoding scheme may be able to accommodate more errors caused by more collisions.

Such increased redundancy may be used for error correction and may also be used to control a probability of "1"s in the encoded length n binary vector (where "1"s indicate that the cell is programmed to the desired level). To have a uniform distribution over the programmed levels, the fraction of "1"s may be set to 1/M. Hence, the available redundancy may be divided between distribution "shaping" and error correction (for dealing with collisions). Optimal allocation of the redundancy may be determined by analysis. In addition, locations of the collision may be taken into account when encoding, similar to a "dirty paper" coding problem and usage of coset coding.

Figure 6:
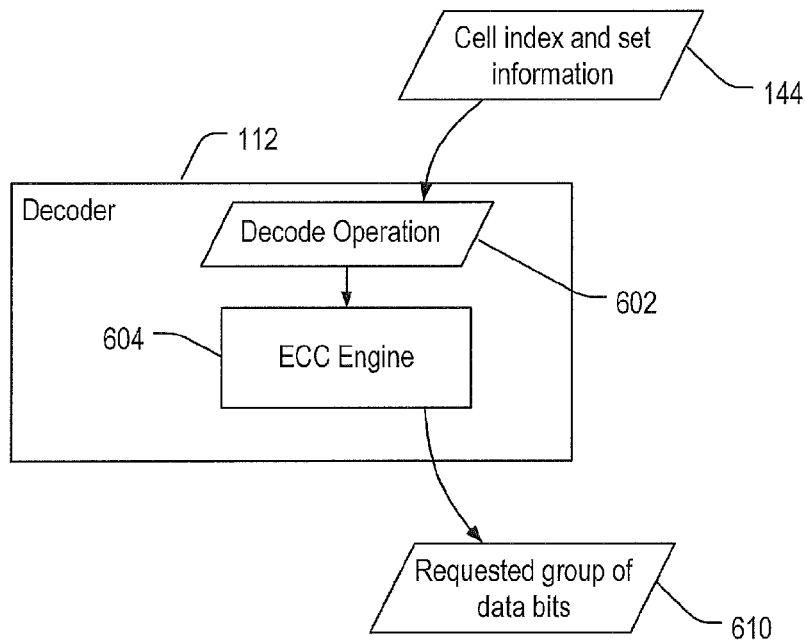
FIG. 6 is a diagram of a second embodiment of a decode operation at the decoder 112 of FIG. 1.

FIG. 6 depicts an embodiment of the decoder 112 for such an encoding scheme that allows collisions. The decoder 112 receives cell index and set information 144 and initiates a decode operation 602. The decode operation 602 may not include decoding a coset code as illustrated in FIG. 5 and may instead include providing the cell index and set information 144 to an error correcting code (ECC) engine 604. For example, the cell index and set information 144 may be provided to the ECC engine 604 as a data word having a bit for each cell with a binary value 0 when the cell has a state in a first set of states and binary value of 1 when the cell has a state in a second set of states. The binary word may be provided to the ECC engine 604, which may perform a conventional ECC operation to recover the requested group of data bits 610.

In contrast to decoding the index and set information 144 according to a coset encoding, as illustrated in FIG. 5, the decode operation 602 may send a data word to the ECC engine 604 having bit values that correspond to sets of states of the read memory cells. For example, a data word "0110 . . . " sent to the ECC engine 604 may indicate that, when a single sense operation is performed to a group of cells, the cell having index 0 corresponds to a first set of states, the cell having index 1 corresponds to a second set of states, the cell having index 2 corresponds to the second set of states, the cell having index 3 corresponds to the first set of states, continuing with a bit value for each cell. The ECC engine 604 may process the data word and generate decoded data corresponding to a requested group of bits.

Figure 7:
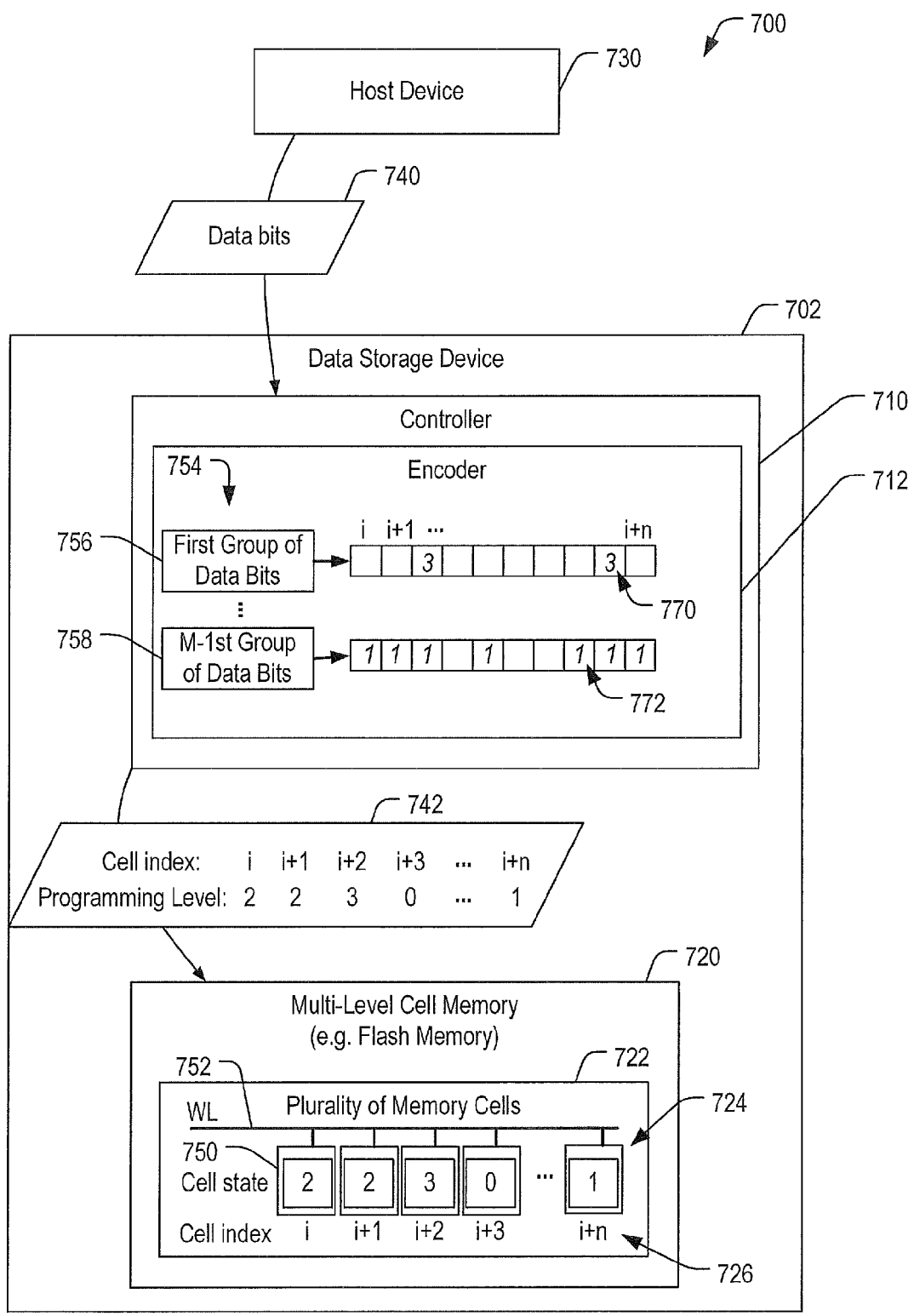
FIG. 7 is a diagram of a data storage device in communication with a host device in which the data storage device encodes information based on divisions of cell states.

Referring to FIG. 7, an illustrative embodiment of a system is depicted and generally designated 700. The system 700 includes a data storage device 702 coupled to a host device 730. The data storage device 702 includes an encoder 712 that encodes information to be stored in a multi-level cell (MLC)

memory 720 based on selecting indices of memory cells to be programmed to each particular programming level of each of multiple disjoint groups of data bits independent of other groups of data bits. For example, the data storage device 702 can be configured to write data to the MIC memory 720 as representations of multiple groups of data bits that can each be read using a single sense operation of cells within the MLC memory 720, such as described with respect to the decoder 112 of FIG. 1.

The data storage device 702 includes a controller 710 configured to control an interface to a host device 730 and to perform management of the MLC memory 720. For example, the data storage device 702 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 702 may be embedded memory in the host device, such as eMMC® (trademark of JEDEC Solid State Technology Association, Arlington, Va.) and eSD, as illustrative examples.

The MLC memory 720 includes a representative plurality of memory cells 722, including a representative cell 750. Each cell of the plurality of memory cells 722 may be accessible via a single common word line 752 of a memory array. For example, the MLC memory 720 may be a non-volatile memory such as a flash memory, and the plurality of memory cells 722 may include a plurality of flash memory cells that are accessible via the single word line 752. The plurality of memory cells 722 is illustrated as each cell having a state 724 that is one of an ordered set of available states for the cell and having a cell index 726 associated with the cell. For example, the cell with cell index illustrated as "i" has a cell state illustrated as state "2". The cell with cell index "i+1" has a cell state "2," and the cell with cell index "i+n" has a cell state "1." The cell states may correspond to programming levels of flash memory cells.

The encoder 712 is configured to receive data bits 740 and to divide the data bits 740 into disjoint multiple groups of data bits 754. For example, if the MLC memory 720 enables setting each memory cell to one of M states, the encoder 712 may divide the data bits 740 into M−1 groups of data bits including a first group of data bits 756 and a M−1st group of data bits 758.

For each particular group of the multiple groups 754, the encoder 712 may be configured to select an index of each memory cell of the plurality of memory cells 722 that is to be programmed to have a first response to a single sense operation corresponding to the particular group, the first response distinctive from a second response corresponding to each memory cell having a non-selected index. For example, a single sense operation performed at the plurality of memory cells 722 may use a single comparison voltage, such as the second single comparison voltage 492 of FIG. 4, to distinguish the indices of memory cells having state "0" or "1" from the indices of memory cells that are programmed to state "2" or "3," The cells having state "2" or "3" may have a first response to the single sense operation indicating a threshold voltage greater than the comparison voltage (e.g. a logical "1" response to the sense operation) and the cells having state "0" or "1" may have a second response to the single sense operation indicating a threshold voltage less than the comparison voltage (e.g. a logical "0" result to the sense operation).

The memory cells having the selected indices may be programmed to, or above, a particular programming level that corresponds to the particular group. For example, a cell corresponding to the M−1st group of data bits 758 may be programmed to state "1," or may be programmed to state "2" or "3" based on whether the index is also selected for programming to encode one of the other groups of data bits. Although FIG. 7 illustrates programming the memory cells having the selected indices to, or above, a particular programming level that corresponds to the particular group, in other implementations the memory cells having the selected indices may be programmed to, or below, the particular programming level.

The selected indices of the memory cells for each particular group of data bits correspond to a representation of the particular group of data bits. The selection of cells to program to the particular state may depend on other groups of data bits. For example, in the coset coding approach shown in FIG. 3, the second group of data bits I2 334 is encoded into codeword C2 (i.e. a representation of the second group of data bits 334) which selects the cells that will be programmed to the state>=2. This selection does not depend only on the second group I2 334—it also depends on codeword C1 (which is a function of the first group of data bits I1 332). In other words, codeword C2 is selected from a set of codewords as a representation of the second group I2 334, but from this set of codewords the codeword C2 is selected having a support set that includes C1, and C1 is a function of the first group of data bits I1 332.

As illustrated in FIG. 7, the first group of data bits 756 is associated with a highest programming level 770. For example, each cell may be in an erase state or may be programmed to/above/below a first programming level, to/above/below a second programming level, or to/above/below a third programming level, such as the illustrated states 410-416 of FIG. 4. The encoder 712 may determine which cell indices correspond to cells that are to be programmed to/above/below the M−1 or highest programming level for the first group of data bits 756, such as programming level "3" when M=4. The encoder 712 may determine which cell indices correspond to cells that are to be programmed to/above/below the M−2 or second highest programming level for a second group of cells, and continue until the encoder 712 has determined which cell indices correspond to cells to be programmed to/above/below the first or lowest programming level 772 for the M−1st group of cells 758.

The encoder 712 may be configured to select the indices according to a coset encoding scheme, such as described with respect to FIG. 3 and Tables 1-4. Each particular memory cell may be set to the erased state or is programmed to a highest programming level determined for the index of the particular memory cell. To illustrate, a cell with index i+2 that is selected to have the programming level "3" for encoding the first group of data bits 756 will also be selected to have the programming level "2" for a second group of data bits (not shown) and to have the programming level "1" for the M−1st group of data bits 758. The cell with index i+2 will therefore be set to the highest programming level "3."

Alternatively, the encoder 712 may be configured to select programming levels corresponding to cell indices for each disjoint group using an encoding scheme that allows "collisions" between the multiple groups 754. For example, a particular cell index may be designated to have programming level "3" when encoding the first group 754 and to be in an erase state when encoding the M−1st group 758. Such collisions may be resolved by using redundancy when encoding the data bits 740 as described with respect to FIG. 6.

The controller 712 is configured to send cell index and programming level information 742 to store the data bits 740 at the MLC memory 720. The MLC memory 720 is configured to program the memory cells according to the selected indices. As illustrated, a cell with index "i" is programmed to a programming level "2," a cell with index "i+2" is programmed to a programming level "3," and a cell with index "i+3" is set to an erase state "0."

The data stored in the MLC memory 720 is therefore stored in a manner such that each of the multiple groups 754 is retrievable using a single sensing operation at the wordline 752, as described with respect to FIG. 1. Read latency may be comparable to SLC-type memory devices and the data storage device 702 may be suitable for high-speed random access memory applications.

Figure 8:
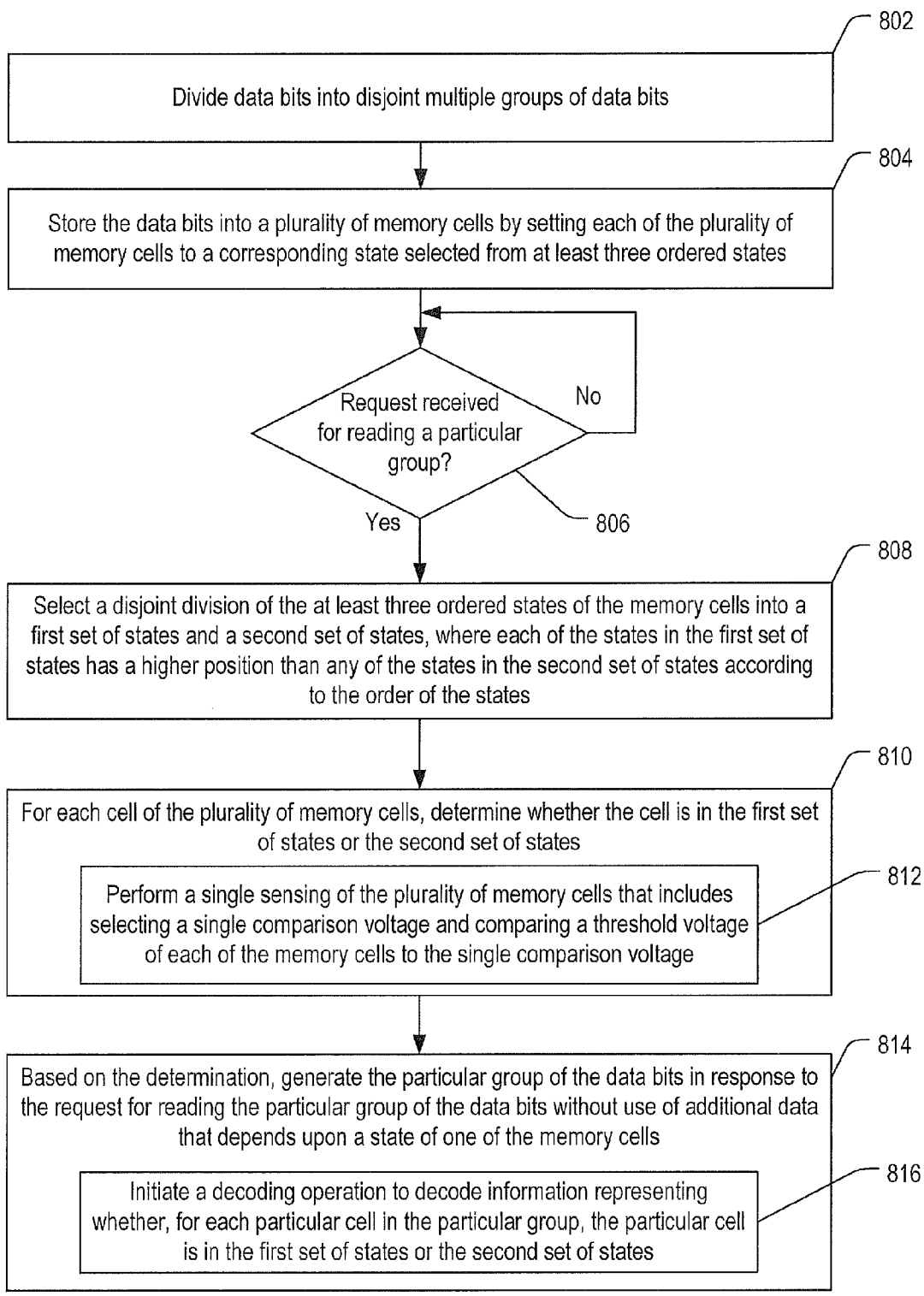
FIG. 8 is a flow diagram of a particular embodiment of a method of decoding data based on disjoint divisions of cell states.

FIG. 8 depicts a particular embodiment of a method of decoding data based on disjoint divisions of cell states. The method includes dividing data bits into disjoint multiple groups of data bits, at 802. For example, the data bits may be received from the host device 130 of FIG. 1 and the controller 110 may divide the data bits (e.g. the data bits 330 of FIG. 3) into disjoint multiple groups, such as the groups 332, 334, and 336 of FIG. 3.

The data bits are stored into a plurality of memory cells, at 804. For example, all memory cells of the plurality of memory cells may be accessible via a single common word line of a memory array. The storing is done by setting each of the plurality of memory cells to a corresponding state selected from at least three ordered states. For example, the storing may be performed as described with respect to programming the wordline 310 of FIG. 3.

A determination may be made whether a request, such as the request 140 of FIG. 1, has been received for reading a particular group of the multiple groups, at 806. For each of the multiple groups of data bits, when a request is received for reading a particular group of the data bits, the method includes servicing the request by selecting a disjoint division of the at least three ordered states of the memory cells into a first set of states and a second set of states, at 808. Each of the states in the first set of states has a higher position than any of the states in the second set of states according to the order of the states. For example, the first set of states may be the set B (1, 2, 3) and the second set of states may be the set A (0) of the first disjoint division of states 420 of FIG. 4.

Servicing the request also includes, for each cell of the plurality of memory cells, determining whether the cell is in the first set of states or the second set of states, at 810. As an illustrative example, the memory cells may be flash memory cells, and the states of the memory cells are ordered according to a threshold voltage of each of the memory cells. In this example, determining whether each cell is in the first set of states or the second set of states may be accomplished by performing a single sensing of the plurality of memory cells. The single sensing may include selecting a single comparison voltage and comparing a threshold voltage of each of the memory cells to the single comparison voltage, at 812. For example, cells may be determined to have a state in set A or set B by performing a sense operation using the first single comparison voltage 490 of FIG. 4.

Servicing the request also includes, based on the determining of whether each of the cells is in the first set of states or the second set of states, generating the particular group of the data bits in response to the request for reading the particular group of the data bits without use of additional data that depends upon a state of one of the memory cells, at 814. To illustrate, the group of data bits may be generated by performing the single sensing operation without performing any additional sensing operations. To illustrate, after performing a sense operation using the first single comparison voltage 490 to determine which cells correspond to set A and which cells correspond to set B, the group of data bits may be generated without performing any other sense operations to attain further information about the state of the cells (e.g. the data bits are generated without knowledge of which cells in set B are in state 1, state 2, or state 3).

A decoding operation may be initiated to decode information representing whether, for each particular cell in the particular group, the particular cell is in the first set of states or the second set of states at 816. For example, the decoding operation may be performed according to a probabilistic coset coding scheme or an algebraic coset coding scheme, such as by providing cell index and set information to the probabilistic coset code reconstruction circuitry 506 or the algebraic coset code reconstruction circuitry 508 of FIG. 5. As another example, the decoding operation may include performing a codeword lookup at a codebook. To illustrate, the codebook may store multiple coset codes, such as the codebook 504 of FIG. 5. A codeword lookup may include selecting a particular coset code of the multiple coset codes based on the particular group of the data bits that is requested, such as conceptually explained with respect to the simple coset code of Tables 1 and 2.

By generating any of the groups of data bits stored in the memory based on a single sensing operation, a high-density multi-level cell memory may be read at a much faster speed than conventional multi-level cell memories that require (on average) multiple sensing operations per group of bits that are read.

Figure 9:
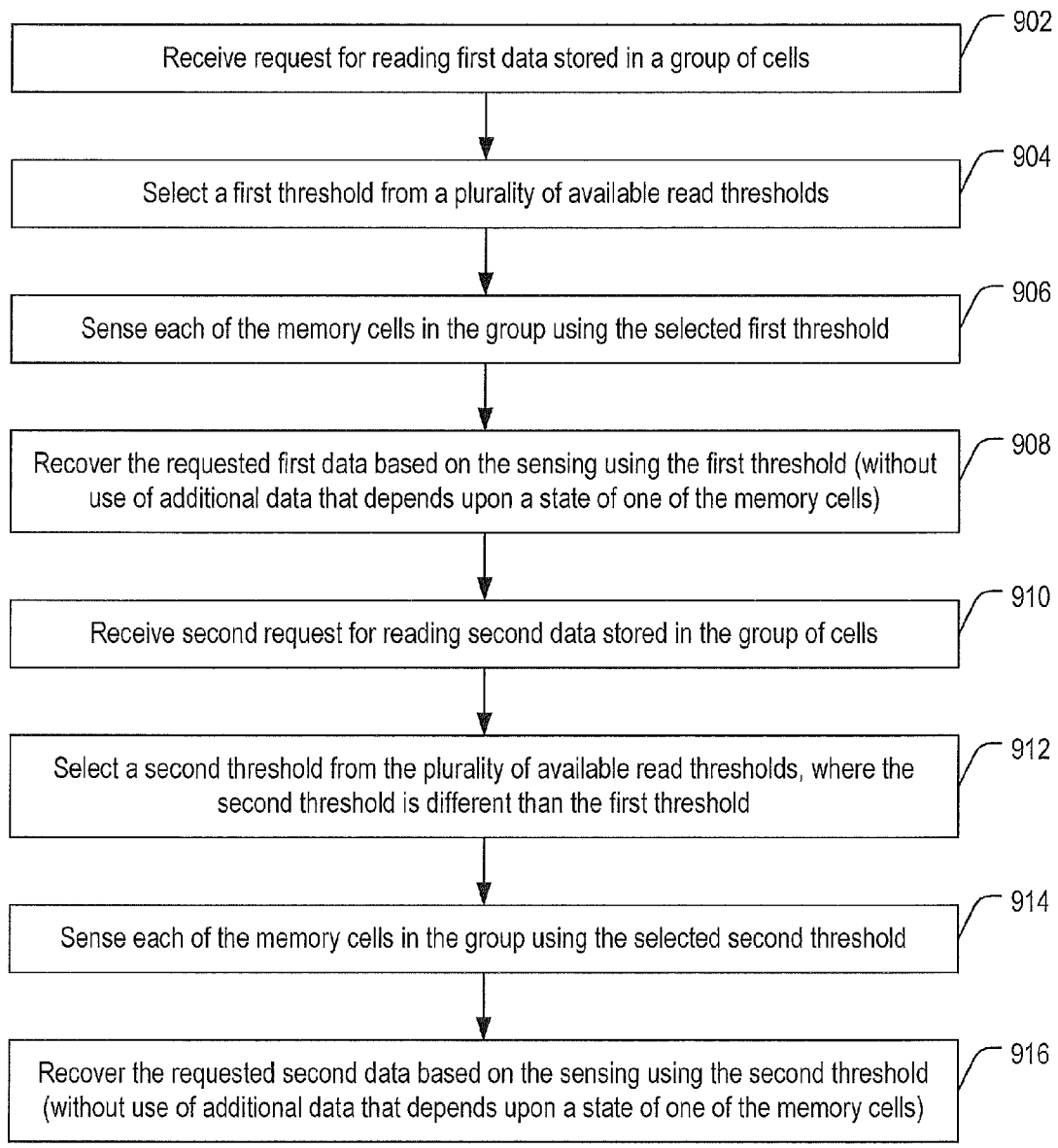
FIG. 9 is a flow diagram of a particular embodiment of a method of decoding data in a group of cells that includes selecting a read threshold for sensing each of the memory cells.

FIG. 9 depicts an embodiment of a method of decoding data in a group of cells that includes selecting a read threshold for sensing each of the memory cells, such as the group of cells 122 of FIG. 1. The method may be performed at a memory including a group of multiple multi-level cell (MLC) memory cells, such as the non-volatile memory 120 of FIG. 1. All memory cells of the group of memory cells may be accessible via a single common word line of a memory array.

A request for reading first data stored in the group of cells may be received, at 902. In response to the request for reading the first data, a first threshold is selected from a plurality of available read thresholds, at 904. For example, the data storage device 102 may receive a request 140 from the host device 130 for first data stored at the group of cells 122. The first data may correspond to the first group of data bits 332 of FIG. 3 that are encoded based on whether each cell is in states 0-2 or is in state 3. The controller 110 of FIG. 1 may select the third single comparison voltage 494 of FIG. 4 from the available voltages 490, 492, and 494 to read the group of cells 122.

Each of the memory cells in the group is sensed using the selected first threshold, at 906. Based on the sensing using the first threshold, the requested first data is recovered, at 908. For example, the requested first data may be recovered via one or more coset decoding techniques described with respect to FIG. 5 or via decoding of a code that allows collisions and using an ECC engine, as described with respect to FIG. 6. The requested first data is recovered without use of additional data that depends upon a state of one of the memory cells.

A second request for reading second data stored in the group of cells may be received, at 910. The second data is different than the first data. In response to the second request, a second threshold is selected from the plurality of available read thresholds, at 912. The second threshold is different than the first threshold. For example, the second data may correspond to the second group of data bits 334 of FIG. 3 that are encoded based on whether each cell is in states 0-1 or is in states 2-3. The second single comparison voltage 492 of FIG. 4 may be selected from the available voltages 490, 492, and 494.

Each of the memory cells in the group is sensed using the selected second threshold, at 914. Based on the sensing using the second threshold, the requested second data is recovered. For example, the requested second data may be recovered via one or more coset decoding techniques described with respect to FIG. 5 or via decoding of a code that allows collisions and using an ECC engine, as described with respect to FIG. 6.

Thus, a single threshold voltage may be selected from a number of available threshold voltages to recover each requested group of data bits from a group of memory cells. Any of the groups of data bits stored at the cells can be recovered via a single sensing operation using the selected threshold voltage for the requested group of data bits. As a result, high-density storage with low read latency is enabled.

In a particular implementation, the memory cells may be flash memory cells. The states of the memory cells may be ordered according to a threshold voltage of each of the memory cells. For example, a state "0" may correspond to a lowest range of threshold voltages, a state "1" may correspond to a next lowest range of threshold voltages, and positions of subsequent states in the order of states may similarly be based on threshold voltages, with higher positions in the order of states corresponding to higher threshold voltages, such as illustrated in FIG. 4. A determination of whether each cell in the group is in a first set of states or a second set of states may be made by performing a single sensing of the group of memory cells. The single sensing may include selecting a single comparison voltage and comparing a threshold voltage of each of the memory cells in the group to the single comparison voltage.

A decoding operation may be initiated to decode information representing whether, for each particular cell in the group, the particular cell is in the first set of states or the second set of states. For example, the decoding operation may be performed according to a coset code, such as a probabilistic coset code or an algebraic coset code. As another example, the decoding operation may include performing a codeword lookup at a codebook. To illustrate, the codebook may store multiple coset codes, and the codeword lookup may be performed by selecting a particular coset code of the multiple coset codes based on whether the read data or the second read data is requested.

Figure 10:
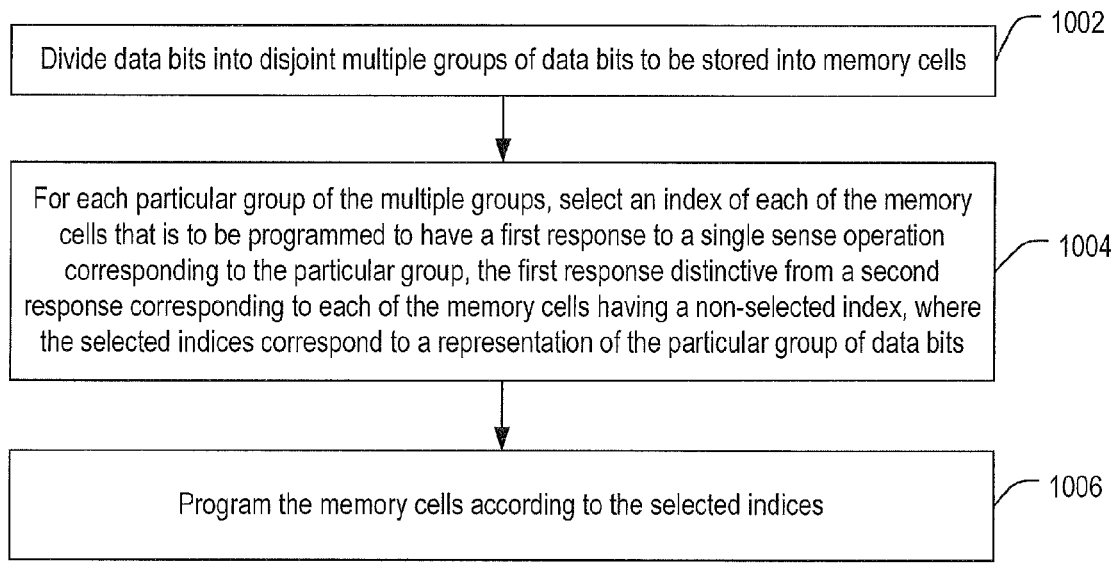
FIG. 10 is a diagram of a particular embodiment of an encode operation at the encoder 712 of FIG. 7.

FIG. 10 depicts a particular embodiment of a method of encoding data. The method 1000 may be performed by an encoder for a MLC memory, such as the encoder 712 of FIG. 7. Data bits are divided into disjoint multiple groups of data bits to be stored into memory cells, at 1002. Each of the memory cells may be configurable to have an erased state or to be programmed to one of multiple programming levels. For example, the memory cells may be in the MLC memory 720 of FIG. 7.

For each particular group of the multiple groups, an index is selected of each of the memory cells that is to be programmed to have a first response to a single sense operation corresponding to the particular group, the first response distinctive from a second response corresponding to each of the memory cells having a non-selected index, where the selected indices correspond to a representation of the particular group of data bits, at 1004 The memory cells are programmed according to the selected indices, at 1006.

For example, selecting the indices may be performed according to a coset encoding scheme, and each particular memory cell is set to the erased state or is programmed to a highest programming level determined for the index of the particular memory cell. As another example, selecting the indices may be performed using an encoding scheme that allows "collisions" between programming levels resulting in contradictory programming levels assigned to a single cell for different groups. Such collisions may be resolved via redundancy in the data stored to the MLC memory, as described with respect to FIG. 6.

Although various components depicted herein are illustrated as block components and described in general terms, such components may include one or more microprocessors, state machines, or other circuits configured to enable the data storage device 102 to perform the particular functions attributed to such components, or any combination thereof. For example, the decoder 112 may represent one or more physical components, such as hardware controllers, state machines, logic circuits, or other structures to enable the data storage device 102 of FIG. 1 to generate data bits based on determining whether cells are in a first set of states or in a second set of states.

In a particular embodiment, the data storage device 102 may be a portable device configured to be selectively coupled to one or more external devices. However, in other embodiments, the data storage device 102 may be attached or embedded within one or more host devices, such as within a housing of a portable communication device. For example, the data storage device 102 may be within a packaged apparatus such as a wireless telephone, a personal digital assistant (PDA), gaming device or console, a portable navigation device, or other device that uses internal non-volatile memory. In a particular embodiment, the data storage device 102 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
dividing data bits into disjoint multiple groups of data bits;
storing the divided data bits into a plurality of memory cells, wherein the storing is done by setting each of the plurality of memory cells to a corresponding state selected from at least three ordered states;
for each of the multiple groups of data bits, when a request is received for reading a particular group of the data bits, servicing the request by:
selecting a disjoint division of the at least three ordered states of the memory cells to divide the at least three ordered states into a first set of states and a second set of states, wherein each of the states in the first set of states has a higher position than any of the states in the second set of states according to an order of the at least three ordered states;

for each cell of the plurality of memory cells, determining whether the cell corresponds to the first set of states or the second set of states; and based on said determining, generating the particular group of the data bits in response to the request for reading the particular group of the data bits without use of additional data that depends upon a state of one of the memory cells.

2. The method of claim 1, wherein the memory cells are flash memory cells, wherein the states of the memory cells are ordered according to a threshold voltage of each of the memory cells, and further comprising, for each cell of the plurality of memory cells, determining whether the cell corresponds to the first set of states or the second set of states by performing a single sensing of the plurality of memory cells.

3. The method of claim 2, wherein the single sensing includes selecting a single comparison voltage and comparing a threshold voltage of each of the memory cells to the single comparison voltage.

4. The method of claim 1, wherein all memory cells of the plurality of memory cells are accessible via a single common word line of a memory array.

5. The method of claim 1, further comprising initiating a decoding operation to decode information representing whether, for each particular cell in the particular group, the particular cell corresponds to the first set of states or the second set of states.

6. The method of claim 5, wherein the decoding operation is performed according to a probabilistic coset coding scheme or an algebraic coset coding scheme.

7. The method of claim 5, wherein the decoding operation includes performing a codeword lookup at a codebook.

8. The method of claim 7, wherein the codebook stores multiple coset codes, and wherein performing the codeword lookup includes selecting a particular coset code of the multiple coset codes based on the particular group of the data bits that is requested.

9. A method comprising:
at a memory including a group of multiple multi-level cell (MLC) memory cells, performing:
receiving a request for reading first data stored in the group of MLC memory cells; and
in response to the request:
selecting a first threshold from a plurality of available read thresholds;
sensing each of the memory cells in the group using the selected first threshold; and
based on the sensing using the first threshold, performing a decoding operation to recover the requested first data, wherein the decoding operation is performed according to a probabilistic coset coding scheme or an algebraic coset coding scheme; and
wherein the requested first data is recovered without use of additional data that depends upon a state of one of the memory cells in the group.

10. The method of claim 9, wherein the first threshold comprises a threshold voltage, wherein sensing each of the memory cells comprises performing a single sensing of the group, and wherein the single sensing includes comparing each of the memory cells in the group to the threshold voltage.

11. The method of claim 9, further comprising, in response to the request, performing a codeword lookup at a codebook, wherein the group of MLC memory cells stores data corresponding to the first data and second data, wherein the codebook stores multiple coset codes, and wherein performing the codeword lookup includes selecting a particular coset code of the multiple coset codes based on whether the first data or the second data is requested.

12. The method of claim 11, further comprising using the particular coset code of the multiple coset codes to generate the requested first data.

13. The method of claim 9, wherein all memory cells of the group of MLC memory cells are accessible via a single common word line of a memory array.

14. The method of claim 9, further comprising:
in response to a second request for reading second data stored in the group of MLC memory cells, wherein the second data is different than the first data:
selecting a second threshold from the plurality of available read thresholds, wherein the second threshold is different than the first threshold;
sensing each of the memory cells in the group using the selected second threshold; and
based on the sensing using the second threshold, recovering the requested second data,
wherein recovering the requested second data-is performed without use of additional data that depends upon a state of one of the memory cells in the group.

15. A data storage device comprising:
a multi-level cell (MLC) memory including a plurality of memory cells; and
a controller coupled to the MLC memory, wherein the controller is configured to:
divide data bits into disjoint multiple groups of data bits;
store the divided data bits into the plurality of memory cells, wherein the storing is performed by setting each of the plurality of memory cells to a corresponding state selected from at least three ordered states; and
for each of the multiple groups of data bits, when a request is received to read a particular group of the data bits:
select a disjoint division of the at least three ordered states of the memory cells to divide the at least three ordered states into a first set of states and a second set of states, wherein each of the states in the first set of states has a higher position than any of the states in the second set of states according to an order of the at least three ordered states;
for each cell of the plurality of memory cells, determine whether the cell corresponds to the first set of states or the second set of states; and
based on determining whether each cell is in the first set of states or the second set of states, generate the particular group of the data bits in response to the request for reading the particular group of the data bits without use of additional data that depends on a state of one of the memory cells.

16. The data storage device of claim 15, wherein the memory cells are flash memory cells, wherein the states of the memory cells are ordered according to a threshold voltage of each of the memory cells, and wherein the controller is further configured for each cell of the plurality of memory cells, to determine whether the cell corresponds to the first set of states or the second set of states by performing a single sensing of the plurality of memory cells.

17. The data storage device of claim 16, wherein the single sensing includes selecting a single comparison voltage and comparing the threshold voltage of each of the memory cells to the single comparison voltage.

18. The data storage device of claim 15, wherein all memory cells of the plurality of memory cells are accessible via a single common word line of a memory array.

19. The data storage device of claim 15, wherein the controller is further configured to initiate a decoding operation to decode information representing whether, for each particular cell in the particular group, the particular cell corresponds to the first set of states or the second set of states.

20. The data storage device of claim 19, wherein the decoding operation is performed according to a probabilistic coset coding scheme or an algebraic coset coding scheme.

21. The data storage device of claim 19, wherein the decoding operation includes performing a codeword lookup at a codebook.

22. The data storage device of claim 21, wherein the codebook stores multiple coset codes, and wherein performing the codeword lookup includes selecting a particular coset code of the multiple coset codes based on the particular group of the data bits.

23. A method comprising:
dividing data bits into disjoint multiple groups of data bits to be stored into memory cells, each of the memory cells configurable to have an erased state or to be programmed to one of multiple programming levels;
for each particular group of the multiple groups, selecting an index of each of the memory cells that is to be programmed to have a first response to a single sense operation corresponding to the particular group, the first response distinctive from a second response corresponding to each of the memory cells having a non-selected index, wherein the selected indices correspond to a representation of the particular group of data bits, and wherein selecting the indices is performed according to a coset encoding scheme and wherein each particular memory cell is set to the erased state or is programmed to a programming level determined for the index of the particular memory cell; and
programming the memory cells according to the selected indices.

24. The method of claim 23, wherein each of the memory cells is accessible via a common word line of a memory array.

25. The method of claim 23, further comprising using the coset encoding scheme to generate the particular group of the data bits.

26. The method of claim 23, wherein the single sense operation includes selecting a single comparison voltage and comparing a threshold voltage of each of the memory cells to the single comparison voltage.

27. A data storage device comprising:
a multi-level cell (MLC) memory including a plurality of memory cells; and
a controller coupled to the MLC memory, wherein the controller is configured to:
divide data bits into disjoint multiple groups of data bits;
for each particular group of the multiple groups, select an index of each memory cell of the plurality of memory cells that is to be programmed to have a first response to a single sense operation corresponding to the particular group, the first response distinctive from a second response corresponding to each memory cell having a non-selected index, wherein the selected indices correspond to a representation of the particular group of data bits, wherein the controller is configured to select the indices according to a coset encoding scheme and wherein each particular memory cell is set to an erased state or is programmed to a programming level determined for the index of the particular memory cell; and
program the memory cells according to the selected indices.

28. The data storage device of claim 27, wherein each of the plurality of memory cells is accessible via a common word line of the MLC memory.

29. The data storage device of claim 27, further comprising using the coset encoding scheme to generate the particular group of the data bits.

30. The data storage device of claim 27, wherein the single sense operation includes selecting a single comparison voltage and comparing a threshold voltage of each of the plurality memory cells to the single comparison voltage.

* * * * *